United States Patent

Takeuchi et al.

4,055,809

Oct. 25, 1977

[54] AMPLIFYING DEVICE

[75] Inventors: Takeshi Takeuchi; Mitsuo Takahashi, both of Tokyo, Japan

[73] Assignee: Hochiki Corporation, Tokyo, Japan

[21] Appl. No.: 676,451

[22] Filed: Apr. 13, 1976

[30] Foreign Application Priority Data

Apr. 18, 1975 Japan .............. 50-52733[U]

[51] Int. Cl.² .............................................. H04H 1/02
[52] U.S. Cl. ..................................... 325/308; 330/65; 179/1 PC
[58] Field of Search ................. 325/2, 308, 352, 356; 330/65, 185, 192, 202, 124, 147, 148; 333/6; 179/1 PC, 170 R; 339/33, 242, 248 R, 248 S; 178/DIG. 13; 358/86

[56] References Cited

U.S. PATENT DOCUMENTS

| 2,757,244 | 7/1956 | Tomcik | 330/65 |
| 3,176,230 | 3/1965 | Collins | 325/308 |
| 3,408,613 | 10/1968 | Baker | 339/33 |

Primary Examiner—Benedict V. Safourek
Attorney, Agent, or Firm—Frank J. Jordan

[57] ABSTRACT

Various types of repeaters which are requisite in combination for making electrical networks such as CATV or MATV systems are unified into a common or universal repeater enabling three fundamental performances comprising a trunk line junction, a branching junction and a distributing junction each use of which is selectively determined by changing connective angles of two plugs containing a branching circuit and a distributing circuit, respectively.

3 Claims, 11 Drawing Figures

BRANCHING CIRCUIT

DISTRIBUTING CIRCUIT

AMPLIFYING DEVICE

BACKGROUND OF THE INVENTION

The present invention relates to repeaters for making a CATV or MATV system network. The wiring of a television reception system (CATV or MATV) requires various repeaters at different places for compensating either a transmissive loss at a trunk line, a branching loss and/or a transmissive loss at a branching junction and a line extended therefrom, or losses at a distributing junction and a multiple of lines distributed therefrom. These different repeaters must be respectively assembled at a factory to perform a specific function corresponding to the purpose of each. Another disadvantage is the large stock of repeaters for different uses that must be kept on hand. This problem is very acute to the field engineer who must always carry a supply of all types of such different repeaters in order to quickly repair electrical circuit failures or effective junctions of installed networks.

The disadvantage that requires various repeaters in combinations to wire a network may be solved by unifying different repeaters into a common repeater. To succeed in such unification, it is in turn required that collective functions be capable of dividing into respective functions corresponding to its use.

One object of the present invention is to provide a universal or common repeater to enable its use for at least one of three fundamental performances to wit: (1) a trunk junction, (2) a branching junction, or (3) a distributing junction with easy selections.

Another object of the invention is to provide a universal repeater which acts to perform respective characteristic functions corresponding to its use in that a branching junction may produce a branching current at a relatively small rate to the primary current of a trunk line so as to prevent the primary current from being excessively attenuated, in that a distributing junction may divide an input current into respective distributing lines at less attenuation, and in that a trunk junction may amplify a primary current to a standardized level, respectively.

A further object is to provide means for determining respective performances by which individual use may be facilitated corresponding to its purpose.

According to the present invention, two amplifiers, one directional coupler and one splitter are so assembled within a housing as to selectively perform fundamentally three characteristic functions, that is (1) a trunk junction, (2) a branching function and (3) a distributing junction. These selective functions are relevantly arranged to make available four operational modes, as follows;

1. For functioning only as a trunk junction,
2. For functioning only as a distributing junction,
3. For functioning as trunk and branching junctions, and
4. For functioning as trunk and distributing junctions.

Functions of the trunk junctions may produce two different outputs such as supply a low or high output in response to respective assortments of combined junctions or a trunk junction only. When the common repeater is used only as a trunk junction, a level of an output may be so amplified at a greater magnitude as to enable long line transmission. And when combined junctions are desired, each output either of a branching or distributing junction can be amplified at a suitable level for compensating measurable losses at junctions and/or lines therefrom while the primary current may be concurrently maintained at a suitable level. Such modes of outputs thus obtained are especially desirable and advantageous for making a network on a large scale.

SUMMARY OF THE INVENTION

A universal repeater is provided by means of which the receptacle housing containing the electronic circuitry, for modifying the signal amplitude in common antenna TV systems, can be used to take care of practically all the conditions heretofore requiring a plurality of different amplifiers, i.e. one for each need. The branching circuit and the distributing circuit plug as well as the receptacle can be mass produced. Inasmuch as the electronic circuits in the plugs are receptacle housing are prewired, the installer and/or service men are provided with convenient means for arranging the plugs to fit the signal amplifying conditions required for peak performance of either CATV or MATV reception, of any particular system, without resorting to separate repeaters which are time consuming, requiring highly skilled personnel, for installation. In addition, the need for keeping a large stock of each kind of several different amplifiers is avoided.

DESCRIPTION OF THE PREFERRED EMBODIMENTS

Figure 1:
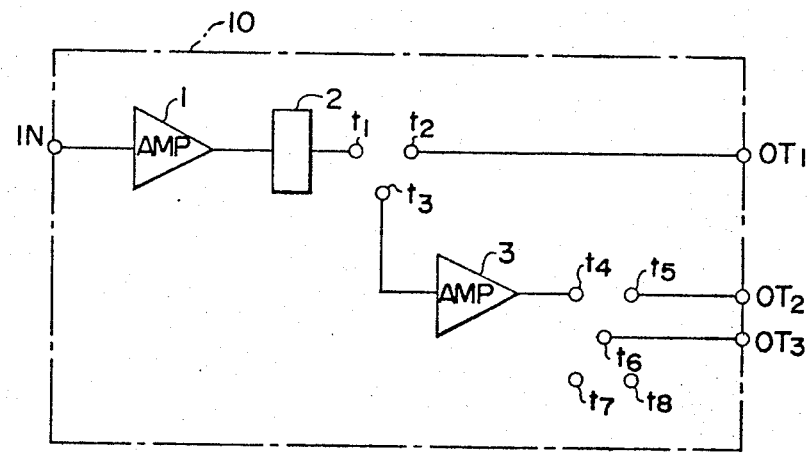
FIG. 1 shows schematically an amplifying circuit assembled in a common repeater according to the present invention.

FIG. 1 shows an embodiment of a common repeater according to the present invention. A first amplifier 1 is provided to connect the input side thereof with an input terminal IN of a receptacle housing 10. An attenuator 2 which regulates the output level is connected to the output side of the first amplifier 1. The output of the first amplifier 1 is connected to one intermediate terminal $t1$ of at least three intermediate terminals $t1 - t3$ which are fixedly disposed at each angle of an equilateral triangle. A second amplifier 3 is assembled to connect the input side thereof with the intermediate terminal t3. The output side of the amplifier 3 is connected to one secondary terminal t4 of at least three secondary terminals t4 - t5 - t6 which are similarly positioned at each angle of a triangular form. The housing 10 has a plurality of an output terminals OT1 - OT2 - OT3. The terminal OT1 is connected to the intermediate terminal t2; the terminal OT2, to the secondary terminal t5; and the terminal OT3, to the secondary terminal t6, respectively. With symmetry to these secondary terminals t4 - t5 - t6, other two empty terminals t7 and t8 are disposed around the common terminal t6 so as to form another triangular form. The two empty terminals t7 and t8 are non-electrical elements used to accept a distributing plug at selective angles. All of the intermediate and secondary terminals t1 - t3 and t4 - t8 are operable as respective jacks, and they are prefereably composed by pairs of a stud and a nut for the purpose of facilitating wiring thereof.

Figure 2A:
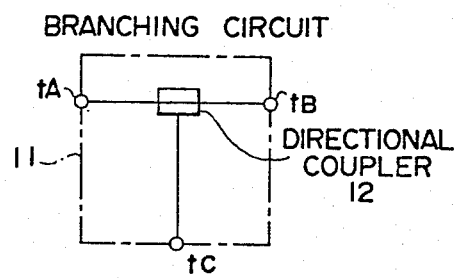
FIG. 2a is a branching circuit diagram comprising a branching plug.
Figure 2B:
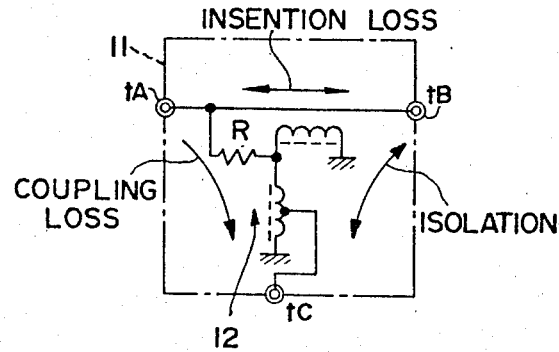
FIG. 2b is a circuit diagram of a directional coupler used for the branching circuit.
Figure 3A:
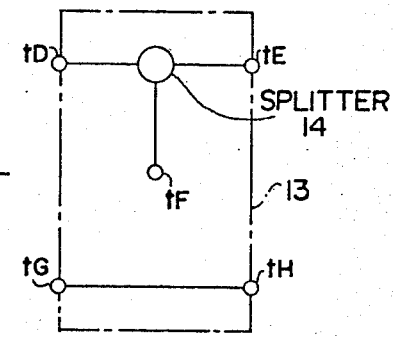
FIG. 3a is a distributing circuit diagram of a distributing plug.
Figure 2C:
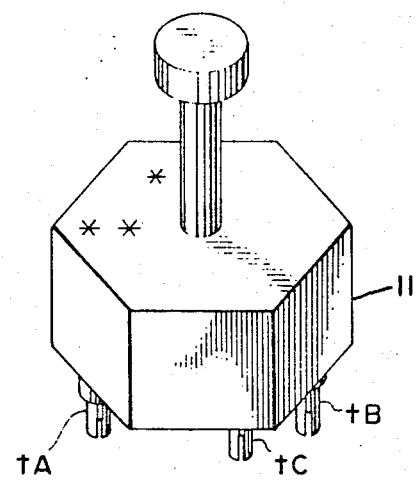
FIG. 2c is a perspective view of the branching three-way plug.

FIG. 2a and 3a show a branching circuit 11 or a distributing circuit 13, respectively. The branching circuit 11 includes a branching network 12, shown in FIG. 2b, which is a kind of a directional coupler. In FIG. 2b, a signal current may be transmitted to either direction from input terminal tA to an output terminal tB, the reverse direction thereof, or from an input terminal tA to a branching terminal tC, but can not pass from the output terminal tB to the branching terminal tC due to its electro-magnetical coupling direction. A branching plug, which is shown in FIG. 2c, contains such directional coupling circuit 12, and is adapted to be inserted at a selected one of two different angles into the intermediate terminals t1 - t3 so as to engage with the terminals tA - tC in respective states of the two different connections.

Figure 3B:
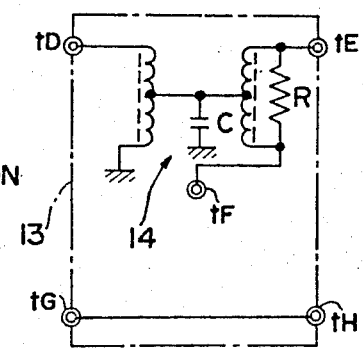
FIG. 3b is a circuit diagram of a splitter for the distributing circuit.
Figure 3C:
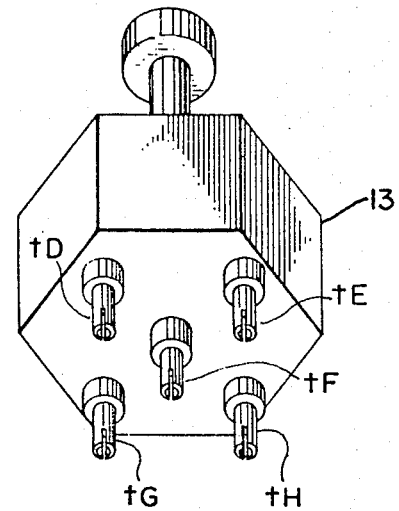
FIG. 3c is a perspective view of the distributing two-way plug.

The distributing circuit 13 contains a distributing network 14, as shown in FIG. 3b, which has an output terminal tD, distributing terminals tE and tF, and also a pair of shorting terminals tG and tH. A distributing or splitting plug, which is shown in FIG. 3c, contains the distributing circuit 14, and is adapted to be inserted at two different angles into the secodary terminals t4 - t8 so as to engage with the terminals tD - tH around a central connection between the terminals t6 and tF, providing respective states of two different connections.

Thus, the common repeater provides four modes to be selectively performed by changing the connection angle either of the branching plug, or the distributing plug, or their combinations thereof, as shown in FIGS. 4 - 7. The following explanation assumes a common repeater such that the first amplifier 1 is used to gain at 20dB, the second amplifier 3 to gain at 25dB, the directional coupler 12 to have a coupling loss of 10dB to the branching terminal tC, and also a negligible small insertion loss less than 1dB at a line between the terminals tA and tB, and the distributing network 14 to have a distributing loss of 4dB to each distributed line. And further it is provided that an input level of television signal reaches the input terminal IN at either 70dB or 80dB over VHF band or UHF band, respectively.

Figure 4:
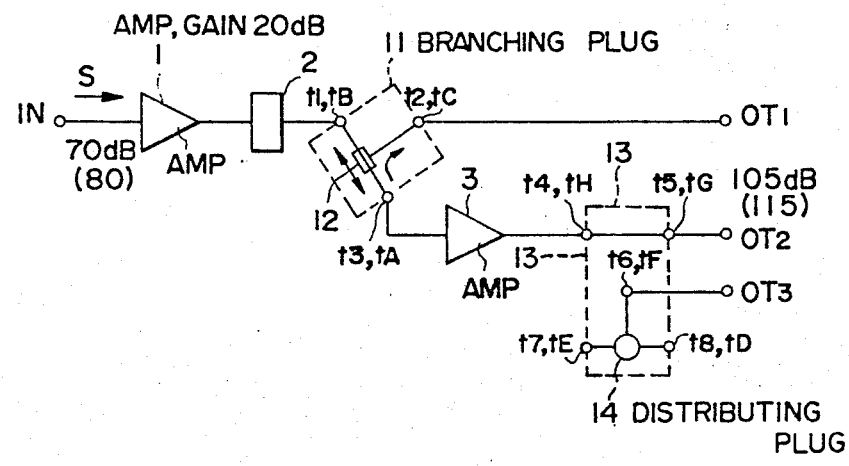
FIG. 4 is a circuit diagram of the repeater with the plugs in a connecting mode providing only a trunk line junction.

FIG. 4 shows the common repeater set to perform only a trunk line junction. The branching plug 11 is inserted into the intermediate terminals t1 - t3 in a position connecting the output terminal tB and the t1, the input terminal tA and the t3, and also the branching terminal tC and the t2. The distributing plug 13 is inserted so as to connect terminals tH, tG, tF, tE and tD with the corresponding secondary terminals t4, t5, t6, t7 and t8, respectively, as shown in FIG. 4. According to two plug connections, when a television signal S of VHF band reaches to the input terminal IN at a level of 70dB, the first amplifier 1 outputs an amplified signal at a level of 90dB, if necessary, after being regulated through the attenuator 2. If the second amplifier 3 as used here is operable with an input level less than 90dB, this attenuator 2 may be manually adjusted to attenuate the output 90dB into, for example, 80dB by 10dB attenuation which will be suitable to the second amplifier 3. The second amplifier 3 which is thus input a signal at level of 80dB may output an amplified signal at a level of 105dB with its 25dB gains, and then the input signal S amplified thus twice is supplied to the trunk line from the output terminal OT2. When the attenuator 2 is not used, an obtainable level of an output should be equal to the sum of two amplification gains. In this trunk line junction, substantially no voltage can appear at the empty output terminal OT1 because a direction from the output terminal tB to the branching terminal tC provides a state of isolation due to the characteristics of the directional coupler. No means is necessary at the output terminal OT1. When a signal of UHF band is input at a level of 80dB, an output level of 115dB may be obtained from the same trunk line junction even if the attenuator 2 is used to attenuate 10dB (as indicated in parentheses in FIG. 4).

Figure 5:
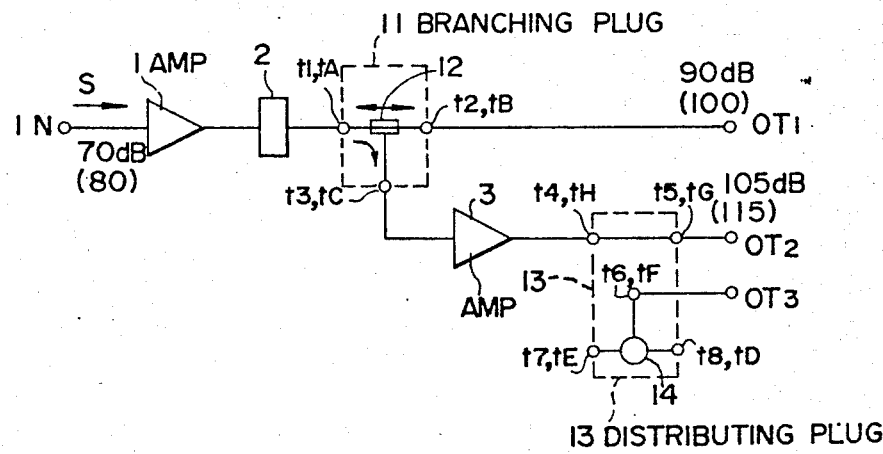
FIG. 5 is a circuit diagram similar to FIG. 4, but with the plugs in a connecting mode concurrently providing a trunk line junction and also a branching junction.

FIG. 5 shows the common repeater set to concurrently perform a trunk line junction and a branching junction. The branching plug 11 is inserted at a different angle into the intermediate terminals t1 - t3 so as to connect terminals tA - tC with corresponding intermediate terminals t1 - t3, respectively, as shown in FIG. 5. The distributing plug 13 remains at the same position as in FIG. 4. The connecting angle of the branching plug 11 is changed a quarter turn from the angle in FIG. 4 to the position shown FIG. 5. According to such altered connections, a trunk line junction is made comprising IN-Amp 1-t1-directional coupler 12-t2-OT1, and also a branching junction is made comprising IN-Amp 1-t1-directional coupler 12-t3-Amp 3-t4-t5-OT2. The directional coupler 12 contained in the plug 11 maintains the primary current running through the terminals tA and tB without substantial attenuation, because a coupling loss forward of the branching line and extended to the branching terminal tC is necessarily given to the directional coupler 12 to restrain loss of electric energy of the primary current running in the trunk line.

When the coupling loss is set at a level of 10dB as in this example, an inserted loss needed to attenuate the primary current may be reduced to a negligible degree of less than 1dB. Accordingly, the VHF television signal S which reaches the input terminal IN at a level of 70dB is amplified into a signal level of 90dB by the first amplifier 1, and then the amplified signal S is output from the output terminal OT1 to a next trunk line after passing the directional coupler 12 without substantial attenuation.

On the other hand, a branched signal S which can be electro-magnetically produced at the branching line extended to the branching terminal tC of the directional coupler 12 when the primary signal S is passing through the terminal tA and tB, is obtained as current at a level such as attenuated by 10dB relative to the primary signal S, due to the branching loss given thereto. That is, the branched signal S having a level of 80dB is supplied from the branching terminal tC to the second amplifier 3 and is then amplified by 25dB gain into a signal level of 105dB. A branch line provided from a trunk line may be thus supplied a substantially amplified signal S from the branching output terminal OT2 of the branching junction selectively provided by the common repeater. Meanwhile the television signal S is of UHF band, probable levels of an input or two outputs shall be read 80dB, 100dB or 115dB, respectively, as illustrated by parentheses. The common repeater can, thus, act concurrently to perform two functions both of the trunk line junction and the branching junction.

Figure 6:
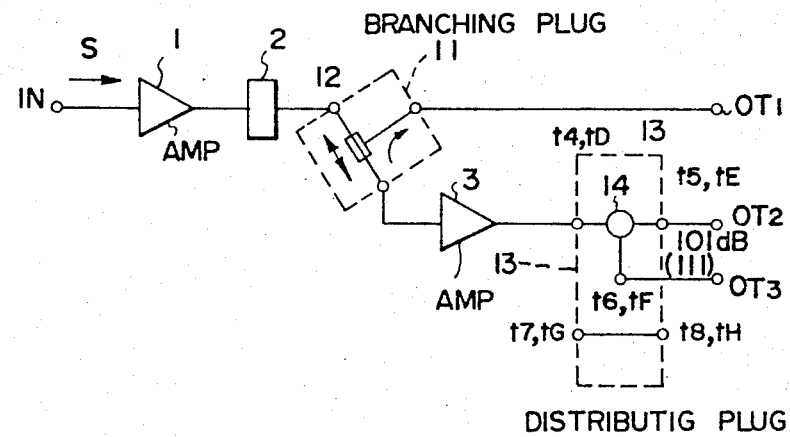
FIG. 6 is a similar diagram with the plugs in a mode providing only a distributing junction such as providing two lines.

FIG. 6 shows the common repeater set to perform only a distributing junction which may operate as an outstanding extension amplifier to supply several outputs at an equal signal level therefrom. The branching plug 11 is inserted into the intermediate terminals t1 - t3 as in FIG. 4 without any output appearing at the output terminal OT1. On the other hand, the distributing plug 13 is inserted into the secondary terminals t4 - t8 so as to connect terminals tD - tH with corresponding secondary terminals t4 - t8 in turn, respectively, as shown in FIG. 6. The two output terminals OT2 and OT3 may supply split signals at an equal signal level therefrom. The attenuator 2 may be used to attenuate, for instance, 10dB if the second amplifier 3 is operable over an input level less than 90dB, as previously mentioned. In this example, when the VHF television signal S reaches the input terminal IN at a signal level of 70dB, the first amplifier 1 outputs an amplified signal S of 90dB level and the attenuator 2 attenuates it into a signal level of 80dB which may be again amplified into a level of 105dB by the second amplifier 3.

When the signal S thus suitably amplified splits at the distributing network 14, each split signal S could be attenuated by 4dB due to splitting loss thereof and then respective output terminals OT2 and OT3 output a split signal S at an equal level of 101dB therefrom. To repeat UHF television signal into several lines, probable input or outputs shall be 80dB or 111dB, respectively, as illustrated by parentheses in FIG. 6. If the second amplifier is operable over an input level such as sums a probable input at the terminal IN and an amplification gain at the first amplifier, the attenuator is not necessary or ajusted to a simple conductor.

Figure 7:
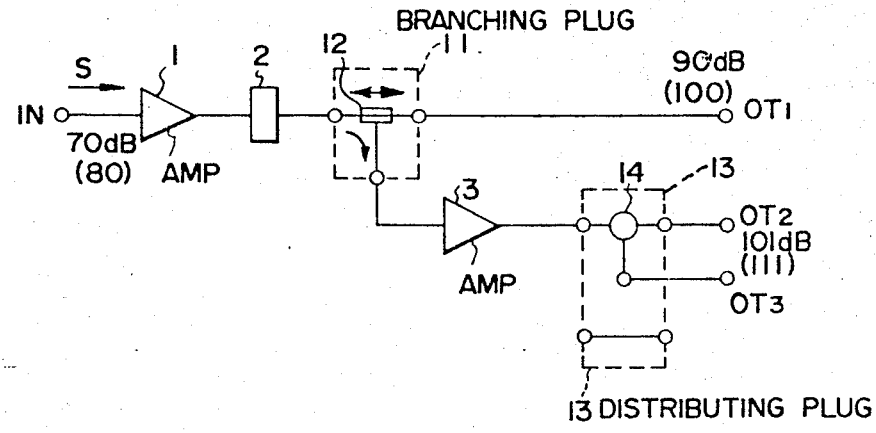
FIG. 7 is a similar diagram with the plugs in a mode concurrently providing a trunk line junction, and a distributing junction for two lines.

FIG. 7 shows the common repeater set to concurrently perform a trunk line junction and a distributing junction of which all of the output terminals OT1 - OT3 may output amplified signals. To provide this mode, the branching plug 11 is inserted into the intermediate terminals t1 - t3 in the same state as in FIG. 5, and the distributing plug 13 is inserted into the secondary terminals t4 - t8 in the same state as in FIG. 6. To prevent the primary signal S from being substantially attenuated, the above-mentioned coupling loss operates similarly at the directional coupler 12 wherein a branched signal may be electro-magnetically produced from the primary signal running in the trunk line.

Accordingly, a VHF television signal S which reaches the input terminal IN at a signal level of 70dB is available from the output terminal OT1 as a signal amplified to a 90dB level through the first amplifier 1, and also is available from the ouput terminals OT2 and OT3 as split signals amplified to a 101dB level through the second amplifier 3 and the distributing network 14. The output level is reduced by 4dB which is a "splitting" loss at the distributing network 14. The attenuator 2 is not necessary because a branched signal is attenuated by the coupling loss. The angle of insertion the distributing plug 13 into the secondary terminals is different by a half turn (180°) when the distribution network 14 is used and not used.

What is claimed is:

1. A common repeater for selectively providing a trunk line junction, a branching junction, a distributing junction, as well as a combination of junctions thereof, which comprises;
    a housing having at least one input technical terminal and a plurality of output terminals,
    a first amplifier having the input side thereof connected to said input terminal,
    intermediate terminals comprising at least three terminals arranged to form an equilateral triangle, one intermediate terminal thereof being connected to the output of said first amplifier, and another being connected to one of said output terminals,
    a second amplifier having the input side thereof connected to the remaining of said intermediate terminals,
    secondary terminals comprising at least three terminals arranged to form a triangle and also two empty terminals disposed with symmetry to the other two terminals, one of said three terminals being connected to the output of said second amplifier, and the other two of said three secondary terminals being respectively connected to the other output terminals,
    a branching plug for said intermediate terminals including a directional coupler and having three adapting terminals connected to each end of said directional coupler, said three adapting terminals corresponding to the form of said intermediate terminals, and
    a distributing plug for said secondary terminals including a distributing network and provided with at least three jack terminals alloted to each distributed end thereof, said distributing plug having also a pair of additional jack terminals shorted therebetween, and said three and additional jack terminals corresponding to said secondary terminals.

2. A universal repeator for TV systems having a common antenna, comprising
    a receptacle housing having two sets of terminal sockets, and
    two plugs having jacks adapted to fit said terminal socket sets in selected positions,
    said housing also having a TV signal input terminal and a plurality of TV signal output terminals,
    said housing also containing electronics signal amplitude modifying circuit means including said terminal sockets and said TV signal input and output terminals, and
    the first plug containing a directional coupler circuit, and the second plug containing a signal distributing circuit,
    whereby junctions of the circuit means can be adjusted by changing the angular positions of said plugs with respect to the corresponding terminal sockets without any output at the TV signal output terminals.

3. A universal repeater as defined by claim 2, in which said circuit in said housing comprises:
    first signal amplifying means connected between the signal input terminal and one of the sockets of the first set of terminal sockets, and second socket of the first set of terminal sockets being connected to one of said signal output terminals, second signal amplifying means connected between the third socket of said first set of terminal sockets and the first socket of said second set of terminal sockets, the second and third sockets of said second set of terminal sockets being connected to separate signal output terminals of said housing.

the first three sockets of said second set of terminal sockets and the corresponding studs of the second plug forming an equilateral triangle, the remaining two sockets of said second set of terminal sockets being cold, and forming with the third socket of said second set of terminal sockets another equilateral triangle diametrically opposite the first equilateral triangle, and a circuit in the second plug connecting said remaining two sockets, said distributing circuit in said second plug being connected to the first three sockets of said second set of terminal sockets.

* * * * *